United States Patent [19]

George

[11] Patent Number: 4,505,771
[45] Date of Patent: Mar. 19, 1985

[54] ARRANGEMENT, APPARATUS, AND METHOD TO FORM LAMINATES, AND THE LIKE SUCH AS COPPER CLAD

[75] Inventor: David W. George, New Castle, Pa.

[73] Assignee: Wean United, Inc., Pittsburgh, Pa.

[21] Appl. No.: 386,504

[22] Filed: Jun. 9, 1982

[51] Int. Cl.³ .............................................. B32B 31/20
[52] U.S. Cl. .................................... 156/285; 156/286; 156/299; 156/303; 156/517; 156/556; 156/563; 156/566
[58] Field of Search ................................ 156/566, 556–560, 156/562, 563, 516–518, 521, 630, 634, 583.3, 572, 297–300, 303, 285–286

[56] References Cited

U.S. PATENT DOCUMENTS

| | | | |
|---|---|---|---|
| 1,315,737 | 9/1919 | Milmoe | 156/571 |
| 1,705,512 | 3/1929 | Warga | 156/572 |
| 3,367,823 | 2/1968 | Clausen et al. | 156/572 X |
| 3,483,059 | 12/1969 | Dinter | 156/285 X |
| 3,873,395 | 3/1975 | Ehlich | 156/382 |
| 4,356,054 | 10/1982 | Gotz | 156/556 X |

Primary Examiner—David Simmons
Attorney, Agent, or Firm—Daniel Patch; Suzanne Kikel

[57] ABSTRACT

An arrangement, apparatus, and method for alternately stacking material, such as copper, glass, etc. to form a stack of uncured laminates in a laminating press line. A material sheet pick-up and depositing head has at least one compartment which receives negative air pressure for a pick-up mode, and positive air pressure for a material sheet depositing mode. A slightly curved convexed surface on the underside of this head may cooperate with the positive pressure in first forcing the center of the sheet downwardly and then outwardly onto the build-up station, whereby air is dispelled from between the sheet and the already uncured stacked laminates, resulting in the sheet being placed smoothly onto the stacked laminates. A conveyor belt system mounted on the head cooperates with the negative air pressure to uncoil a sheet of material from a let-off unit.

36 Claims, 10 Drawing Figures

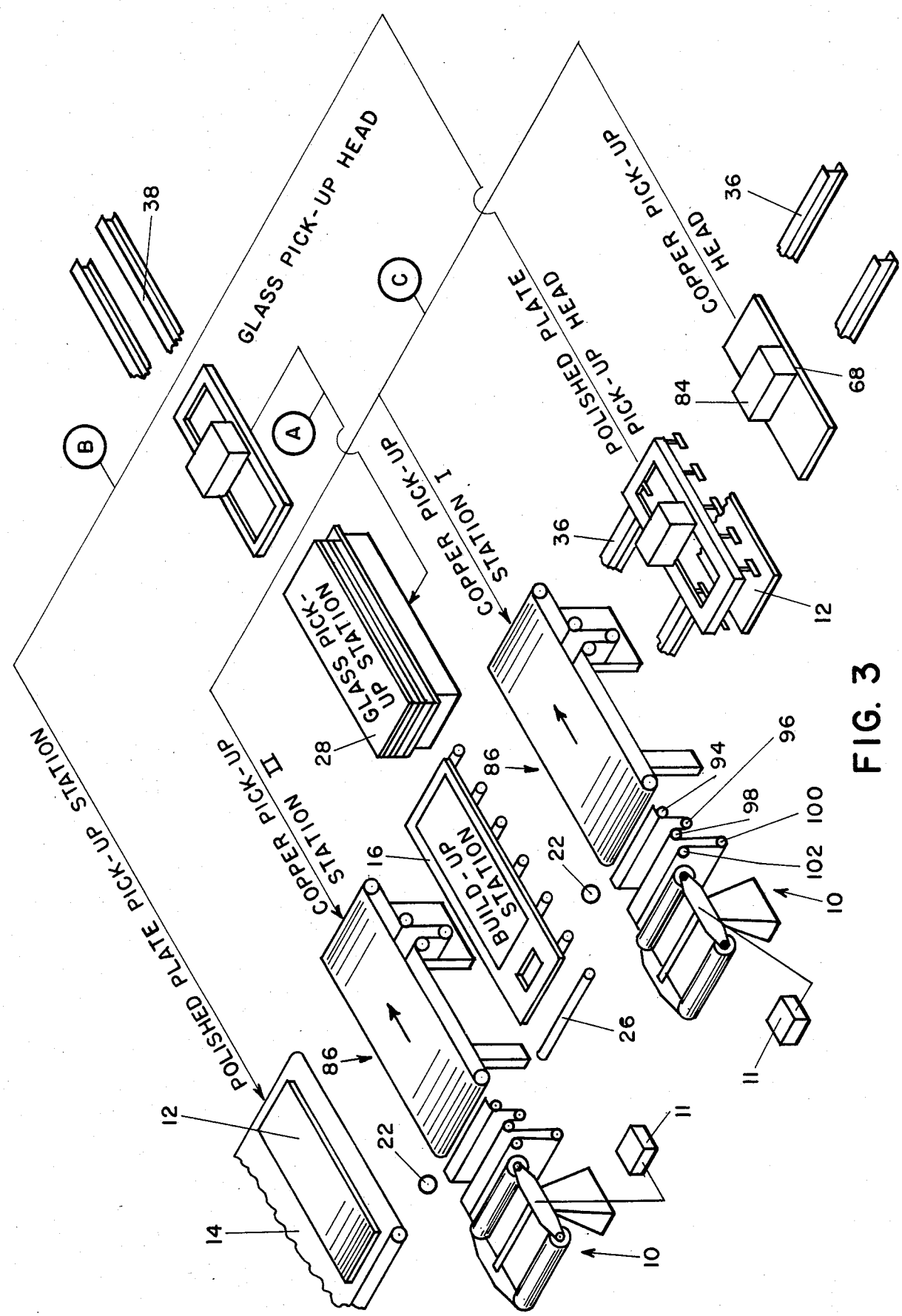

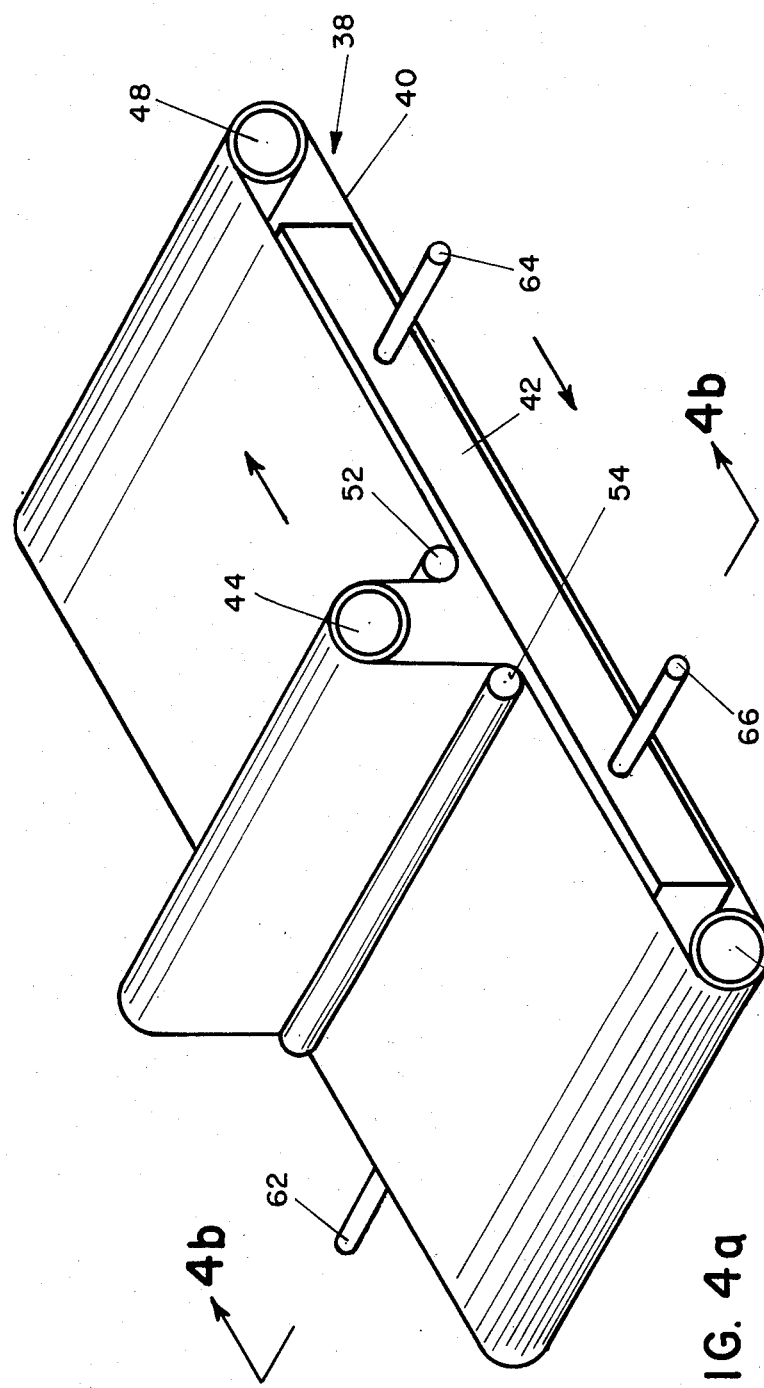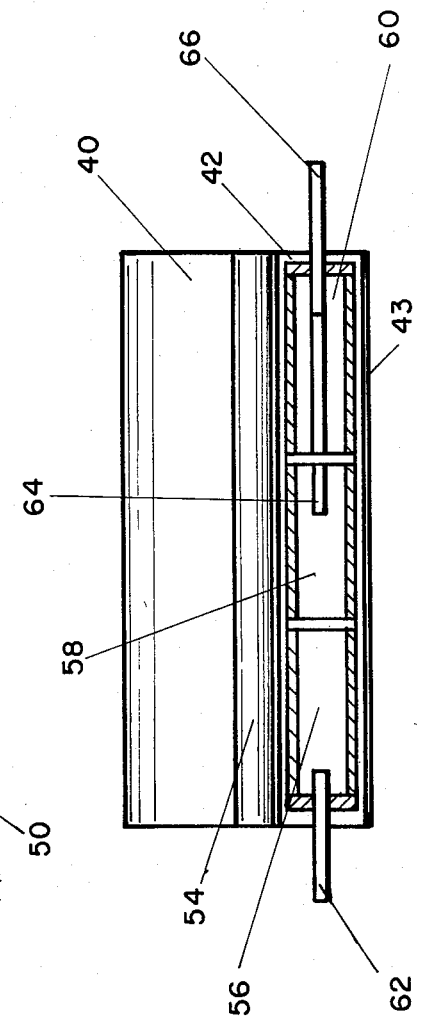
FIG. 4a
FIG. 4b

ARRANGEMENT, APPARATUS, AND METHOD TO FORM LAMINATES, AND THE LIKE SUCH AS COPPER CLAD

FIELD OF THE INVENTION

The invention relates to a new arrangement, an apparatus, and a method for stacking sheets of material in a build-up area to form one or several laminate units such as copper clad, decorative, etc. which are later cured in a press of a laminating press line. More particularly, the subject invention is concerned with forming copper clad laminate units in a copper clad laminating press line.

BACKGROUND OF THE INVENTION

It will be appreciated that the invention has a wide general use to handling film-like materials, but for the purpose of description it will be discussed as applied to a copper clad laminate.

A copper clad laminate is the basic material used to produce printed circuit boards containing electrical components, such as capacitors, resistors, transistors, or more recently, micro-electronic chips. In the curing or laminating process, a glass sheets pack, containing a resin, is bonded in between two copper sheets to form what is commonly called a rigid board, or several copper sheets may alternate with a glass sheet to form what is called a multi-layer circuit board. As is well known, the glass sheet acts as an insulator between the copper areas where the electrical conduction is to occur. To provide for the electrical conduction, some of the copper on the cured laminate unit to which the components are mounted is removed by an etching process leaving only a copper path which then is used to interconnect the various components to produce an electrical circuit.

In preparation for forming uncured copper clad laminates in a press line, the copper sheets and the packs of glass are conveyed to a material build-up area and placed onto a carrier tray in this area which area consists of an arrangement of material stations for positioning the materials for the pick-up or stacking process and heads for picking-up and depositing the materials in the build-up station. In the picking-up and depositing of the copper sheet, an inherent problem exists in that since the copper sheet is relatively thin, wrinkling of the copper and/or air entrapment between the copper and glass sheets can effect the bonding of these materials, whereby an ineffective or inefficient path for the conduction of electrical energy through the circuit is created. In order to attempt to eliminate the wrinkling and to assure the copper is laid down smoothly onto the build-up station in the build-up area, presently the operator has to use a device, such as a rod, to manually "smooth out" the copper sheet, which are important factors in its production rate. Such known procedure has proven to be expensive, timely, and unreliable. Also, in the prior arrangement, the copper sheet let-off units were arranged in line and at opposite ends of the build-up station, which created an inherent delay in the operation of the polished plate and glass pick-up heads, and the inability to properly and quickly service and maintain the let-off units.

It is therefore, an object of the present invention to provide a material build-up arrangement which will pick-up and deposit a copper sheet in the build-up area with little or no wrinkles, and thus, a minimum amount of or no air entrapment between the copper sheets and the uncured stacked sheets of material.

It is still further object of the present invention to reduce the manpower and cost presently involved whereby an accurate placement and an automatic "smoothing out" of the copper sheet onto the build-up station occur.

A still further object of the present invention is to improve the overall production performance of the sequential and interrelated operation of the various stations with reference to the build-up station.

It is still a further object of the present invention to provide an arrangement for forming at least one uncured laminate unit, consisting of several sheets of different material in a build-up area of a laminating press line comprising a build-up station for receiving said several sheets, at least two material pick-up stations, each located on opposite transverse sides and adjacent to said build-up station, each material pick-up station comprising means for supporting at least a coil of said material and for dispensing said material from said coil, conveying means located adjacent said supporting and dispensing means for picking up the leading end of said coiled material, and constructed and arranged to carry said material along said material pick-up station a distance to form an as yet unsheared desired length sheet of said material, and means located between said conveying means and said supporting and dispensing means for shearing said sheet of material; said conveying means including a means for transporting sheets selectively from said material pick-up stations to said build-up station for depositing therein.

A further object of the present invention is to provide an apparatus for picking up a copper sheet from a copper sheet pick-up station, transporting it, and depositing it into a build-up station to form at least an uncured laminate unit in a build-up area of a laminating press line, each unit consisting of a metal plate, a pack of glass sheets, and at least one copper sheet comprising a frame constructed and arranged to travel at least above said copper pick-up and said build-up stations, comprising a rectangular head mounted on said frame and having a length and a width approximately equal to that of said laminate unit and having a surface positionable adjacent to said copper sheet, chamber means in said head for receiving and delivering negative air pressure against said sheet for a copper pick-up mode and positive air pressure against said sheet for a copper sheet depositing mode, and means for delivering said negative and positive pressures to said head.

And still a further object of the present invention is to provide a method for stacking uncured copper clad laminate units in a build-up area of a laminating press line, each unit consisting of a metal plate, a glass sheet, and at least one copper sheet, and wherein a copper sheet head is used to pick up, transport, and deposit a copper sheet into a build-up station, the steps comprising uncoiling a predetermined length of copper sheet from a copper let-off unit into a copper sheet pick-up station where said copper sheet head is positionable adjacent to said copper sheet and above said copper sheet station, supplying negative air pressure into said head so that said copper sheet is picked-up by said head in a manner that the center line of said head corresponds to that of said copoer sheet, motivating said copper sheet transversely to position said head directly above said build-up station, and supplying positive air pressure into said head so that said copper sheet is deposited onto said build-up station in a manner that the center line of said copper sheet corresponds to that of said stacked laminate units.

DESCRIPTION OF THE DRAWINGS

These and other objects will be better appreciated and understood when the following description is read along with the drawings of which:

FIGS. 2 and 3 are schematics illustrating two different arrangements for the build-up area, employing an apparatus and an arrangement thereof of the present invention;

FIG. 4a is a schematic view of a first embodiment of a sheet pick-up and depositing head which also appears in FIG. 2;

FIG. 4b is a cross-sectional view taken along lines 4b—4b of FIG. 4a;

FIG. 5b is a cross-sectional view taken along lines 5b—5b of FIG. 5a;

FIG. 6b is a cross-sectional view taken along lines 6b—6b of FIG. 6a; and

DESCRIPTIONS OF THE PREFERRED EMBODIMENTS

Figure 1:
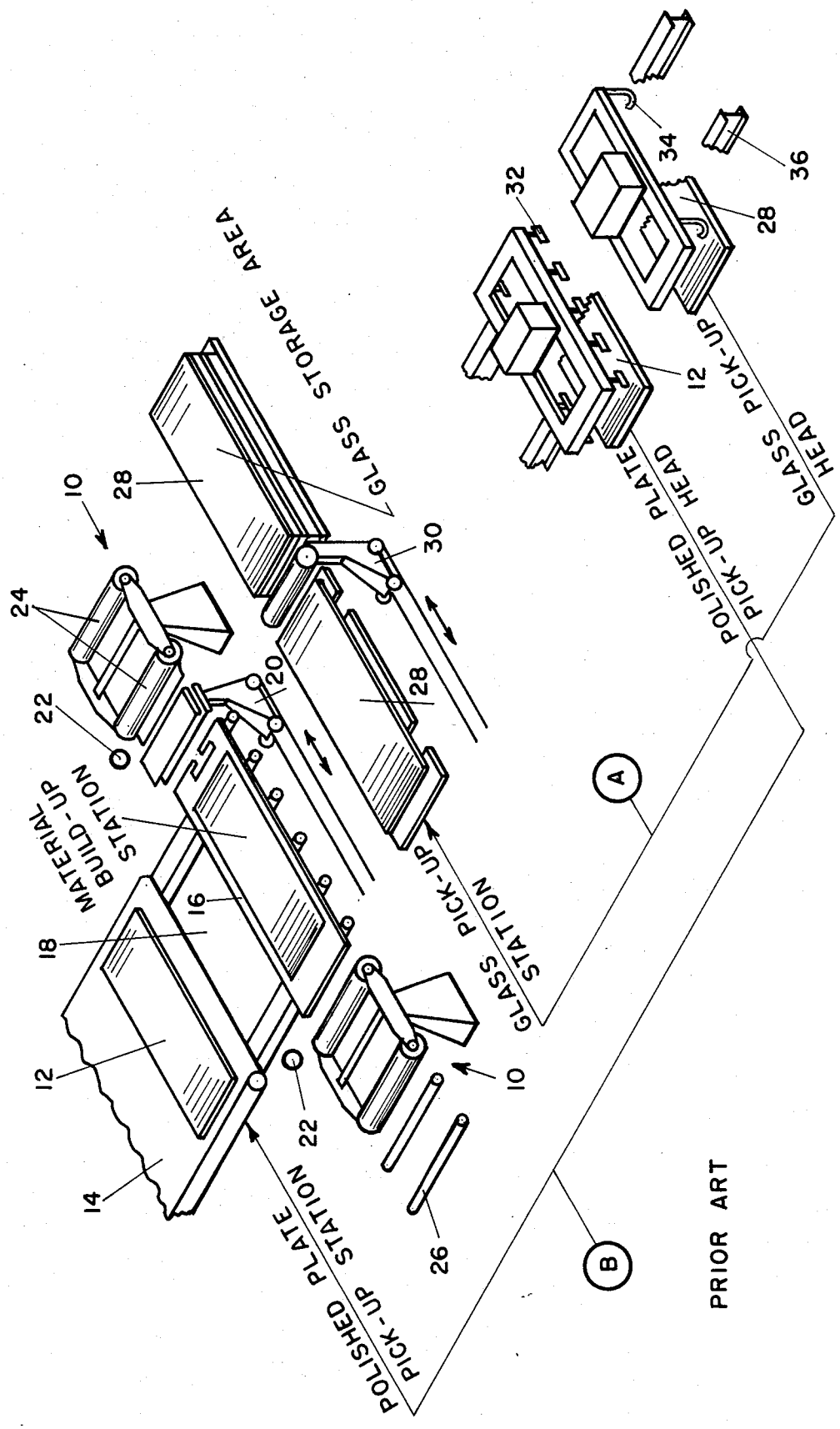
FIG. 1 is a schematic view illustrating a prior art arrangement for stacking copper clad laminates in a build-up area.

FIG. 1 typifies a recent previous arrangement and machinery used in a build-up area of a laminating press line and as the legends indicate, consists of three stations and two material pick-up heads. To the left of a material build-up station is a polished plate pick-up station and to its right is a glass pick-up station. The two pick-up heads are arranged to run parallel to and above the three stations. These two heads are motivated along beams which are part of a structural frame (not shown). Both of the material pick-up heads operate directly above their respective stations and this is indicated by lines A and B. The heads are shown spaced from the actual operating positions of FIG. 1 for clarity only. Aligned at the longitudinal ends of the build-up station is a copper sheet turret type let-off unit 10.

A polished plate 12 is brought to its respective station by a conveyor belt 14, and a carrier tray 16 is brought by a general type conveyor 18 underneath the polished plate pick-up station and into the build-up station. In the build-up station, sheets of copper are uncoiled by a copper dispensing unit 20, which clamps down onto the end of the copper roll, and upon its travel pulls a copper sheet longitudinally across the build-up station a distance equal to the length of the materials on the carrier tray. A shear 22 then cuts this indexed length of copper sheet from the copper let-off roll 24. The dispensing unit 20 travels back and forth across the build-up station laying a copper sheet down as aforesaid for each unit of the laminate. When the uncured laminate units are formed and stacked, the carrier tray 16 is moved along rollers 26 underneath the let-off units 10 in a desired direction away from the build-up area. Since the copper is being let-off at a level higher than the build-up station, air has a tendency to get trapped underneath the copper as it is being dispensed and laid down from a higher to a lower level. As mentioned above as an object of the present invention this necessitates an operator to manually use a rod to attempt to "smooth out" the copper sheet onto its supporting surface, thereby dispelling the trapped air underneath the copper sheet. When a roll of copper is completely uncoiled, the copper let-off unit 10 is rotated to bring a second copper roll into a position immediately adjacent to the material build-up station, for uncoiling thereof. Instead of both let-off units 10 dispensing copper sheets one may dispense a releasing paper, more about which is said later.

Sheets of pre-collated glass 28 are brought into a glass storage area by a fork truck, and are dispensed through a glass dispensing unit 30 into its respective station in preparation for its pick-up and placement in the stacking process.

Polished plate pick-up head through vacuum cups 32 picks up a plate in its respective station and glass pick-up head through hydraulic or pneumatically operated, plastic-coated finger means 34 picks up the glass in its respective station. As previously mentioned, these two heads ride on beams 36 by suitable means (not shown in FIG. 1) which may be pneumatically, hydraulically, or electrically operated, and raising and lowering of these heads is done through a piston cylinder assembly-guide rod assembly (not shown in FIG. 1).

Movement of the two heads and the copper dispensing unit 20 is such that according to normal practice the heads alternate with the copper dispensing unit 20 to lay down the sheets of material to form uncured laminate units, which consists of a polished plate, a pre-collated stack of glass sheets, and one or more copper sheets. For a rigid board, the order of the sheets of material on the carrier tray and Kraft paper starting from the bottom to the top may be as follows: (1) a polished plate; (2) a copper sheet; (3) the stack of glass sheets; and (4) a copper sheet. In some cases, for instance, in forming a multi-layer board the second copper sheet may be replaced by a releasing paper, which permits the release of one laminate unit from the polished plate. Several units of uncured laminates are stacked on a single carrier tray, onto which another sheet of Kraft paper is placed, and are placed into the laminating press (not shown) where heat and pressure is applied to produce cured laminates which are cut into the desired dimensions for circuit boards.

The plate 12 is made of stainless steel, and it is polished so that a smooth finish is transferred onto the cured copper laminate. The thickness of the copper sheet may range from 0.0005 to 0.007 inches. The thinner the copper, the less resistance it has to the surrounding air pressure, and therefore, the greater the need for precise control and supervision of the laying of the copper sheet onto the uncured stack.

The aforesaid with regard to FIG. 1 is well known in the art for forming stacks of uncured laminate units. What is to follow describes the present invention, which employs a novel arrangement, an apparatus, and a method for the picking-up and depositing of the various materials in the build-up area.

It will be appreciated that the invention has a wide general use for handling film-like materials, but for the purpose of description it will be discussed as applied to a copper clad laminate.

Since part of the present invention relates to a novel arrangement of elements and the sequence of operation and the elements themselves follow well-known practice, it is not necessary to describe in detail the make-up of these illustrated elements, such as, the heads for the polished plate and glass and their motivation and control systems.

Figure 2:
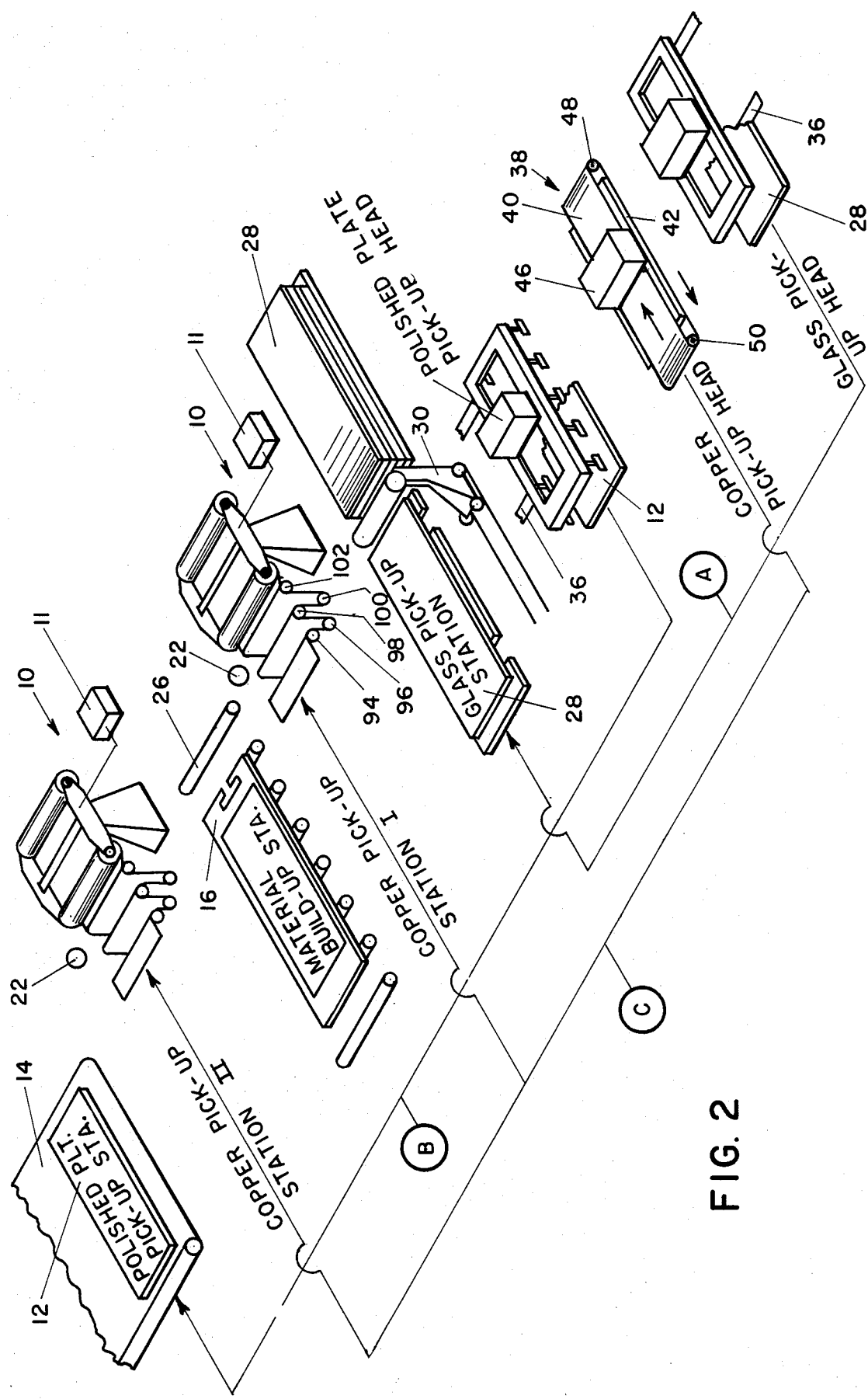

In referring to FIG. 2, there is an arrangement of the present invention showing the copper sheet pick-up head positioned between the glass and polished plate pick-up heads. Copper let-off units 10 are arranged opposite each other transversely to the build-up station, and define separate pick-up stations for the copper sheets. This particular arrangement of the machinery used in the material build-up area is due to the use of a copper sheet pick-up head and its ability to pick up and dispense copper sheets from the let-off units 10 into the copper pick-up station, and then into the build-up station. In this FIG. 2, all three pick-up heads are tandemly arranged and travel along beams 36 above the several stations for the stack forming procedure. The three heads are shown in an off-set position in FIG. 2 for clarity, but, as in FIG. 1, it is to be understood that lines A, B, and C indicate that the heads operate from above their respective stations.

FIG. 3 illustrates an arrangement where the glass pick-up head is located perpendicularly to the path of movement of the copper and polished plate pick-up heads, at one of the longitudinal ends of the build-up station.

Figure 5A:
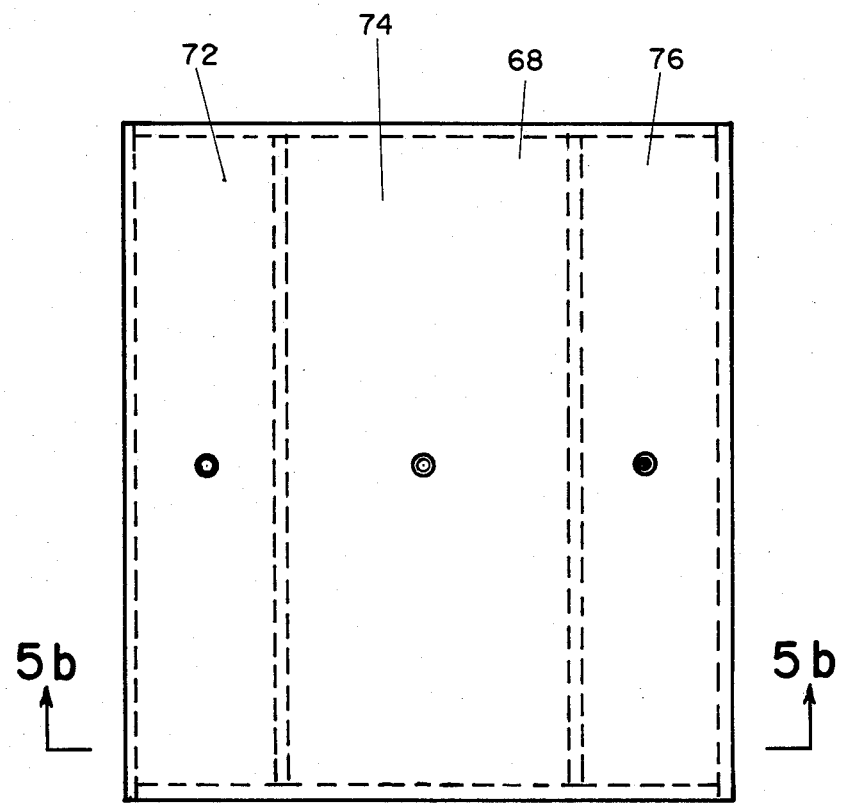
FIG. 5a is a schematic plan view for a second embodiment of a copper sheet pick-up and depositing head, which appears also in FIG. 3.
Figure 5B:
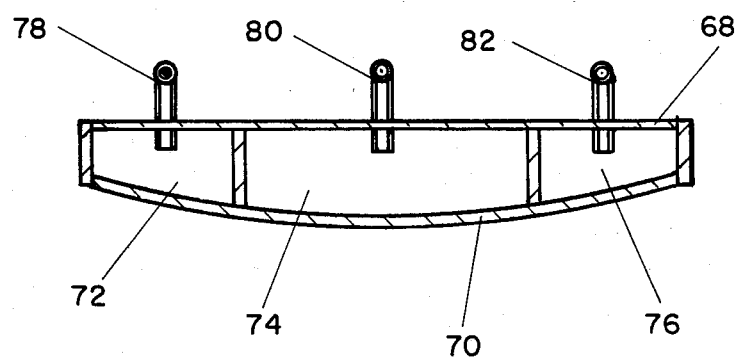
Figure 6A:
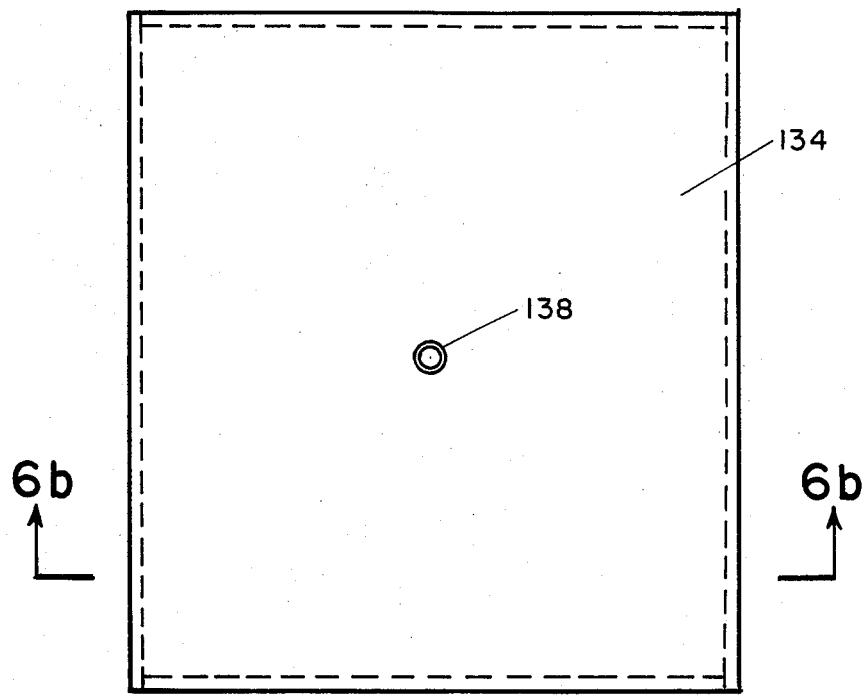
FIG. 6a is a schematic plan view for a third embodiment of a copper sheet pick-up and depositing head.
Figure 6B:
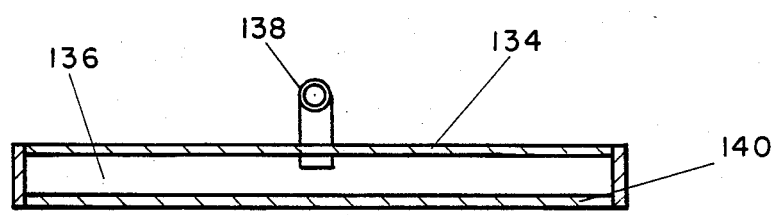
Figure 7:
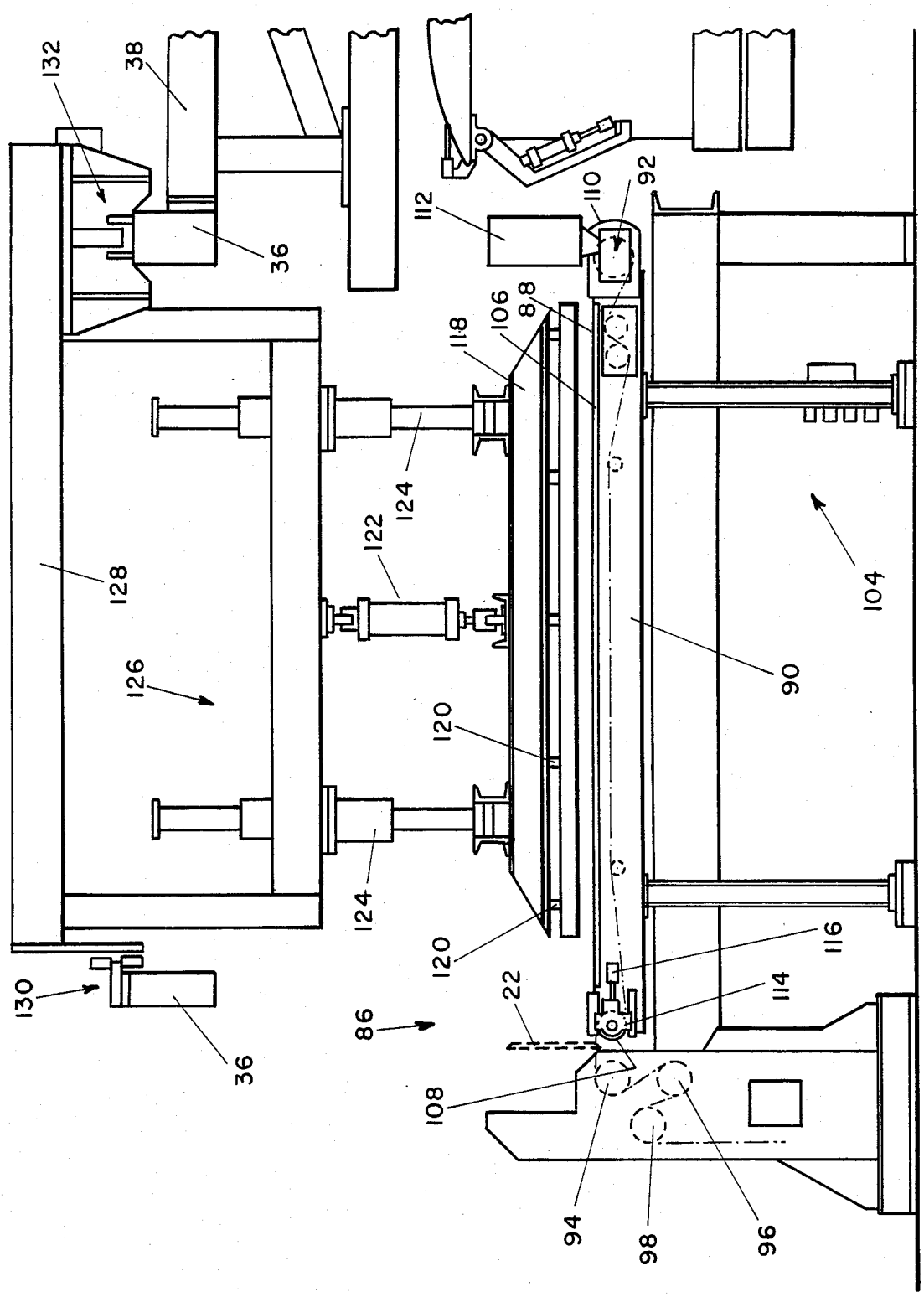
FIG. 7 is an elevation view depicting the manner in which the copper pick-up head of FIGS. 5a and 5b is mounted and supported by a overhead structural system.

As noted, the design for the copper pick-up head in this FIG. 3 is a second embodiment of the present invention, whereas that shown in FIG. 1 is a first embodiment. For both these arrangements the let-off units 10 may dispense a releasing paper instead of copper, as explained for the arrangement of FIG. 1. Hereinafter these two materials may broadly be referred to as "let-off materials". FIGS. 4 and 5 give detailed desighs for these two embodiments shown in FIGS. 2 and 3, respectively, and FIG. 6 shows a third and a preferred embodiment which may replace the pick-up head in FIGS. 3, 5a, and 5b. FIG. 7 shows the copper pick-up head and a construction for its mounting on the beams 36, and a portion of the glass pick-up head and a construction for its mounting on a beam system 38 for the arrangement of FIG. 3.

As to the first mbodiment shown in FIGS. 2, 4a, and 4b, a continuous conveyor belt system 38 is mounted on and made a part of the copper pick-up head. This conveyor belt system 38 on copper pick-up head through pressure means which will be explained shortly, picks-up a leading end of the coiled copper and by its moVement in a direction away from the copper let-off unit 10 (shown by the arrows) uncoils and supports a strip of copper which is sheared from its roll by one of its shears 22. The mounting of the belt 40 on a frame 42 of the head is clearly shown in FIG. 4a. It is driven through suitable means (not shown) by a drive shaft 44 located in an enclosure 46 shown only in FIG. 2. Shafts 48 and 50 are idler shafts, and shafts or rods 52, 54 (located also in enclosure 46) are used to maintain belt 40 in a taut condition. The above mentioned pressure means for causing an uncoiled copper sheet or strip to adhere to the belt, consists of three separate air tight pressure chambers extending transversely across the frame 42, wherein each chamber extends the length of the frame. On the underside surface of frame 42 is a straight sheet carrying surface 43 but which can be slightly curved as that of FIG. 5b. and more about which will be said later. These chambers in FIG. 4b are designated as chambers 56, 58, and 60. Conduits 62, 64, and 66, respectively in these chambers conveys an amount of pressure necessary for picking-up and depositing the copper sheet. For a copper sheet pick-up mode, the copper pick-up head is immediately adjacent a let-off unit 10, and a vacuum is created simultaneously in all three chambers, causing the leading end of an as-yet uncut sheet from the copper roll to be picked-up. The carrying portion of the conveyor belt 40 is advanced by a suitable control (not shown) in a direction away from unit 10 a predetermined amount so that the length of the uncoiled copper equals that of the stacked material, after which it is sheared.

Negative pressure of a small order will be continuously and simultaneously supplied into these three chambers for carrying the copper sheet while the conveyor belt 40 is held stationary until the head is positioned directly above the build-up station. At this time, for the depositing mode, the same amount of pressure but positively applied is first introduced into the center chamber 58 with a slight delay before positive pressure is introduced simultaneously into the side chambers 56 and 60. This procedure for laying a copper sheet forces the center of the sheet downwardly first, followed by a "smoothing out" effect by the side chambers 56 and 60. The combination of the curved convexed surface 43 on the underside of frame 42 and the positive pressures supplied in the chambers as described above squeezes out all or most of the air between the copper sheet and the stacked material.

A description for the second embodiment will be given with reference to FIGS. 3, 5a, and 5b. Again, a frame 68 of a copper sheet pick-up head has a slightly curved convex underside surface 70 (shown exaggerated in FIG. 5b), and three chambers indicated as 72, 74, and 76. Conduits 78, 80, 82 located in enclosure 84 (FIG. 3) on top of the frame 68 deliver either the positive or negative air pressure to their respective chamber depending on whether a copper sheet is to be picked-up or deposited according to the teachings of the first embodiment. These chambers 72, 74, and 76 extend transversely across the frame 68. This second embodiment for a copper pick-up head does not have a conveyor belt system mounted on the frame 68, but instead employs a belt conveyor-indexing system 86 shown schematically in copper pick-up station of FIG. 3 and in detail in FIG. 7. Each let-off unit 10 has this indexing system 86 for accurately measuring the length of sheet before it is sheared, which is shown best in FIG. 7 and which consists of: a continuous conveyor belt 88 mounted in a frame 90; a pulley-drive system 92 for rotating the conveyor belt; and a series of wrapper rolls 94, 96, 98, 100, and 102, including a dancer roll 100 around which the copper sheet travels from the let-off unit 10.

In FIG. 7, frame 90 is supported on a conveyor support structure 104 located immediately adjacent to and alignable with each let-off unit 10. A chamber 106 for receiving positive and negative pressures is in frame 90, and the different pressures are supplied to this chamber 106 in a time and copper sheet mode sequence which is to be explained shortly. The pulley drive system 92 consists of a pulley 108 which through a speed reducer 110 is driven bv motor 112, and tensioning of the belt 88 is done by a take up unit 114 and adjusting screw 116.

A copper sheet is let-off and travels in a serpentine manner around rolls 102, 100, 98, 96, and 94 and is pick-up by the conveyor system 86 at which time negative air pressure is supplied into chamber 106 for proper and assured placement of the copper sheet on belt 88. The copper is indexed into the copper sheet pick-up station a desired length equal to that of the stack of uncured laminates. This length may be equal to the length carried in the dancer loop with dancer roll 100 in its lowest position or twice the length of the travel of roll 100, i.e. if the desired length is 6 feet then the travel of roll 100 would be 3 feet. The surface speed of the conveyor belt 88 can be the same speed or slightly faster than that of the drive for the S-wrapper rolls 98, 96, and 94 so that the copper sheet is dispensed into the copper pick-up station an amount equal to the length carried in the dancer loop. This provides ease of travel for the copper sheet off of the dispenser roll 24 into the copper pick-up station, and allows a positive urging by the conveyor of the copper strip to assure the measured length will be received by the conveyor, i.e. that the sheet is dispensed onto the conveyor belt 88 in a straight fashion. Rolls 94, 96, and 98 and dispenser roll 24 supporting the rolled copper are driven, while dancer roll 100 and roll 102 are idle rolls. The method for controlling and indexing the dispensing of the let-off material from let-off 10 onto conveyor 86 with the desired material length equalling that in the dancer roll loop is as follows: dispenser roll 24 is driven to uncoil a sheet of let-off material and since the dancer roll 100 is electrically connected to the drive for roll 24, when dancer roll 100 is in its lowest position, roll 24 stops rotating. The drives for the S-wrap rolls 94, 96, and 98 and conveyor 86 are started to index the material onto the conveyor 86. This causes the dancer roll 100 to be raised and when it reaches its highest position, the drives for the S-wrap rolls 94, 96, and 98 and the conveyor system 86 are stopped. The material is clamped and cut with shear 22, and the let-off drive starts feeding the material into the dancer loop until the dancer roll reaches its lowest position wherein the let-off drive stops, and the above sequence is repeated. Control for this indexing is done through control 11, which may consists of limit switches for rolls 24, 94, 96 and 98. This indexing method applies also to the let-off and S-wrap arrangement of FIG. 2. A device for sensing the rotation of rolls 24, 94, 96 and 98 or the movement of the sheet on the conveyor system 86 can be used for this indexing operation.

The shear 22 (shown best in FIG. 7) automatically cuts the required copper length for the copper sheet and this length is correctly indexed so that its leading and trailing ends are in line with and directly under corresponding longitudinal and transverse edges of the copper pick-up head in the copper sheet pick-up station. Throughout the indexing operation, negative pressure in chamber 106 retains the copper sheet on the belt 88.

FIG. 7, as stated, relates to an arrangement shown in FIG. 3, and illustrates a construction for mounting and supporting the copper pick-up head of FIGS. 5a and 5b. The frame 68 shown in FIGS. 5a and 5b is resiliently connected to a main body 118 by springs 120, which body 118 is raised and lowered by piston cylinder assembly 122 and is guided through its travel by guide rods 124 located on opposite sides of body 118. A U-shaped structure 126 supports the piston cylinder assembly 122 and the rods 124, and is connected to an overhead structure 128 which rides on the beams 36 through a wheel track system 130 located to the left of FIG. 7, and a round-ways system 132 to the right of this FIG. 7.

In a copper sheet pick-up mode of a copper sheet out of copper sheet station, positive air pressure is supplied into chamber 106 of frame 90 while negative air pressure is supplied into the copper sheet pick-up head, to force the copper sheet to be accurately lifted off of belt 88 and transferred onto the undersurface 70 of the copper pick-up head. The amount of air pressure supplied to chamber 106 can be the same as that supplied into the chambers for the copper pick-up head.

Immediately to the right of FIG. 7 is illustrated a portion of the glass pick-up head system, wherein the head travels on a beam system 38 running perpendicularly to the beam system 36 for the copper and polished plate pick-up heads in the arrangement shown in FIG. 3.

With this arrangement shown in FIG. 3, the time cycle for forming and stacking the uncured laminate units is quicker than that of FIG. 2, since the travel of the glass pick-up head is time independent from that of the other two material pick-up heads which is due to the fact the beam system 38 for the glass pick-up head is different from that of the other two pick-up heads. The beam system 38 extends beneath the beam system 36, thereby permitting the glass pick-up head to travel unrestrictedly into the build-up station. This improvement in the time cycle in forming laminate units in the arrangement of FIG. 3 will become better appreciated when the sequence for both arrangements of FIG. 2 and 3 are given below. (Initially, carrier tray 16 with Kraft paper on it is positioned into the build-up station).

A sequence of operation for FIG. 2:

The pick-up head for a polished plate 12 is positioned over its respective station wherein it picks-up the plate 12 and is then moved above the build-up station to deposit the plate and return to its respective station. The copper pick-up head being directly above copper pick-up station I and the glass pick-up head being above the glass pick-up station picks up the copper and glass sheets respectively. The copper pick-up head is indexed over the build-up station where it deposits a copper sheet in a manner described earlier for FIGS. 4a and 4b onto the polished plate. This step is followed by the indexing and depositing of a sheet of glass into the build-up station, while the copper pick-up head now receives copper sheet from copper station II and the polished plate head picks up another polished plate. The copper pick-up head is indexed and deposits the copper sheet into the build-up station. This process is repeated until several units are formed to make up a book of uncured laminate units; each unit consisting of a polished plate, a copper sheet, a precollated glass pack, and a copper sheet.

The sequence of operation for FIG. 3:

The polished plate is brought to the build-up station by its pick-up head. While this is being done the copper conveyor 86 receives copper from let-off 10 in copper station I and glass is picked-up from its station. The polished plate and the copper pick-up heads travel back to where another polished plate 12 and a copper sheet from let-off 10 of station II can be picked up. This copper sheet is then indexed and deposited onto the build-up station on top of the polished plate. Both heads are then indexed to where the copper sheet is at let-off station I and the polished plate head is at the build-up station. The glass pick-up head, carrying a sheet of glass 28 travels beneath the other two heads, directly above the build-up station, deposits the glass 28 onto the copper, and returns to its respective station. A copper sheet from let-off Station I is index over the build-up station and is deposited onto the glass sheet. while the polished plate pick-up head is indexed above the polished plate station in preparation for the pick-up of another polished plate. This continues until the desired number of uncured laminate units are formed on the carrier tray 16. Glass sheets are deposited quickly since its head does not have to depend on the movement and the clearance of the other two heads from the path of travel, as does that of FIG. 2.

The sequence of operation for both arrangements of FIGS. 2 and 3 can be automated or computerized to give the above mentioned sequence for the depositing of the sheets of material, or the sequence can be varied.

It is to be noted that all the pick-up heads of FIGS. 2 and 3 are moved independently relative to each other and are connected for movement to a centralized vacuum system, however, the copper pick-up head and the conveyor system 86 of FIG. 3 may have a separate pressure system.

FIG. 6 shows a second embodiment for a copper pick-head which as mentioned is a preferred embodiment to be used in conjunction with the arrangement of FIG. 3. It consists of a frame having only one chamber for receiving positive or negative pressure for the appropriate operating modes according to the teachings described for the head of FIGS. 5a and 5b.

It is to be further noted that a construction similar to that of FIG. 7 for supporting and suspending the copper pick-up head may be provided for the pick-up heads shown in FIGS. 4a, 4b, 6a, and 6b.

In accordance with the provisions of the patent statutes, I have explained the principle and operation of my invention and have illustrated and described what I consider to represent the best embodiment thereof.

I claim:

1. An arrangement for forming at least one uncured laminate unit, consisting of several sheets of different material, in a build-up area of a laminating press line comprising:
    a build-up station for receiving said several sheets,
    at least two material pick-up stations, each located on opposite transverse sides and adjacent to said build-up station,
    each material pick-up station comprising:
    means for supporting at least a coil of said material and for dispensing said material from said coil,
    conveying means located adjacent said supporting and dispensing means for picking up the leading end of said coiled material, and constructed and arranged to carry said material along said material pick-up station a distance to form an as yet unsheared desired length sheet of said material, and
    means located between said conveying means and said supporting and dispensing means for shearing said sheet of material, said conveying means including a means for transporting said sheets selectively from said material pick-up stations to said build-up station for depositing therein.

2. An arrangement according to claim 1, wherein said conveying means comprises a continuous belt conveyor system.

3. An arrangement according to claim 2, wherein said conveyor system is stationarily mounted in said material pick-up station.

4. An arrangement according to claim 2, wherein said conveyor system is mounted on said sheet transporting means for movement therewith.

5. An arrangement according to claim 1, wherein said coiled material is copper, and wherein said laminate unit consists of a metal plate, a pack of glass sheets, and at least one copper sheet.

6. An arrangement according to claim 5, having a metal plate pick-up station and a glass pack pick-up station with a plate pick-up and depositing means and a glass pack pick-up and depositing means mounted to travel directly above at least their respective stations and said build-up station,
    wherein said copper sheet transporting means is located between and in transverse alignment with said plate and glass pick-up and depositing means, and
    wherein said three material pick-up means are arranged in a manner to travel transversely in time sequence with respect to each other between their respective pick-up stations and said build-up station to form said uncured laminate units in said build-up station, and
    means for motivating said three pick-up means in said time sequence, including means for raising and lowering thereof in said stations.

7. An arrangement according to claim 5, having a metal plate pick-up station and a glass sheet pick-up station with a plate pick-up and depositing means and a glass pack pick-up and depositing means mounted to travel directly above at least their respective stations and said build-up station,
    wherein said copper sheet transporting means is located in transverse alignment with said plate pick-up means, and
    wherein said glass pack pick-up and depositing means and said glass pack sheet station are located longitudinally of and in alignment with said build-up station, and
    wherein said copper transporting means and said plate pick-up and depositing means are arranged in a manner so to travel transversely in time sequence with respect to their relative positioning to each other between their respective pick-up stations and said build-up station, and said glass pick-up and depositing means is arranged in a manner to travel longitudinally of said build-up station in time sequence with said copper transporting means and said plate pick-up means to form said uncured laminate units in said build-up station, and
    means for motivating said three pick-up means in said time sequence, including means for raising and lowering thereof in said stations.

8. An arrangement according to claim 3, wherein said conveyor belt system is constructed and arranged in a manner that said material carrying portion of said belt moves in a direction away from said coil supporting means,
    wherein said conveying means further includes air pressure means for delivering negative pressure against said belt, and
    wherein for said pick-up of said leading end and carrying of said sheet from said coil, said negative air pressure is applied simultaneously with said movement of said belt.

9. An arrangement according to claim 8, wherein said transporting means for said sheet from said coil is located above said conveyor system, and wherein said air pressure means includes means for delivering positive air pressure against said conveyor belt to force said sheet from said coil in a direction towards said sheet transporting means for said sheet from said coil.

10. An arrangement according to claim 4, wherein said conveyor belt system is constructed and arranged in a manner that said material carrying portion of said belt moves in a direction away from said coil supporting means, and wherein said transporting sheet means for said sheet from said coil comprises means for delivering negative air pressure against said portion of said belt simultaneously with said movement of said belt for said pick-up of the leading end and carrying of said sheet from said coil.

11. An arrangement according to claim 10, wherein said sheet transporting means for said sheet from said coil further comprises means for delivering positive air pressure against said belt for said depositing of said sheet from said coil in said build-up station.

12. An arrangement according to claim 1, wherein said sheet transporting means for said sheet from said coil comprises:

a frame constructed and arranged to be raised and lowered relative to said stations, a rectangular member connected to said frame having a length and width approximately equal to that of said material sheet and said laminate unit, chamber means in said member constructed and arranged to receive and deliver negative air pressure against said sheet from said coil for said material sheet pick-up and carrying operation and positive air against said sheet for said depositing operation, and means for delivering said positive and negative pressures into said head, and wherein said conveying means further includes means located beneath said transporting means for said sheet from said coil and said carried sheet on said conveying means for applying positive air pressure upwardly against said sheet from said coil in a manner to cooperate with said negative air pressure in said transporting means for said pick-up of said sheet from said coil by said transporting means.

13. An arrangement according to claim 1, wherein said conveying means further includes means for indexing said material sheet said predetermined length.

14. An arrangement according to claim 13, wherein said indexing means comprises a series of wrapper rolls including a dancer roll around which said material sheet travels in a serpentine manner and forms a loop with said dancer roll and the rolls adjacent to said dancer roll, and wherein the length of said material in said dancer loop equals said predetermined desired length.

15. An arrangement according to claim 13, wherein said indexing means consists of limit switches.

16. An apparatus for picking up a film-like material, such as a thin copper sheet from a copper sheet pick-up station, transporting it, and depositing it into a build-up station having a supporting surface, to form at least an uncured laminate unit in a build-up area and wherein because of the thinness and lightness of the copper sheet there is a tendency for objectionable air pockets to become entrapped under said copper sheet when deposited, comprising:

a sheet carrying means constructed and arranged to travel above and to and from said copper pick-up and build-up stations, including:

a member having a length and a width approximately equal to that of said sheet and having a surface positionable adjacent to said copper sheet, integral chamber means in said member arranged to communicate with said positionable surface for receiving negative air pressure in a manner to cause said sheet to adhere to said surface for a copper sheet pick-up mode and for receiving positive air pressure in a manner to cause said sheet to be forced away from said surface for a copper sheet depositing mode, and means for selectively delivering said negative and positive pressures into said chamber means, said pressure selective means including means for controlling the application of said positive pressure in a manner that said copper sheet is deposited by forcing a first portion thereof against said supporting surface of said build-up station, and thereafter by forcing the remaining portions of said copper sheet against said supporting surface so that any entrapped air is progressively forced away from said first portion to the edge of said copper sheet from where the air will escape.

17. An apparatus according to claim 16 wherein said chamber means has a positionable surface formed by at least three air tight chambers arranged across the width of said member, and said pressure selective means includes means for delivering said negative air pressure simultaneously to said chambers for said pick-up mode and replacing said negative air with said positive air in said chambers in a time sequence so that said positionable surface cooperates with said pressure in said chambers to deposit said copper sheet evenly and smoothly onto said laminate unit with a minimum of air between said copper sheet and said laminate unit.

18. An apparatus according to claim 17, wherein said surface of said member carries said copper sheet and is curved transversely relative to the longitudinal axis of said member in a manner that the lowest point of said member coincides with the center of said member.

19. An apparatus according to claim 16, wherein said chamber means consists of a chamber arranged approximately across the total width of said member, and wherein said adjacent surface of said member is of a straight configuration and immediately contacts said copper sheet.

20. An apparatus according to claim 16, further comprising:

means for moving said frame between said build-up and said copper pick-up stations, and means for raising and lowering said frame for said copper sheet pick-up and depositing modes.

21. An apparatus according to claim 16, wherein said copper sheet is first in coiled form on a copper let-off unit located in said copper sheet pick-up station, and said member further comprises:

a power-driven continuous conveyor belt system mounted on said member and constructed and arranged in a manner to cooperate with said negative air pressure in said chamber means to pick-up a leading end and carry said copper a predetermined distance equal to the desired length for said copper sheet.

22. An apparatus for receiving and depositing film-like material such as thin copper sheets used in forming laminates, and wherein because of the thinness and lightness of the copper sheet there is a tendency for objectionable air pockets to become entrapped under said copper sheet when deposited, comprising:
- a transport member having a material carrying surface of substantially the same shape and size of the surface of the material to be transported,
- means for selectively introducing a negative and positive pressure into said member,
- said surface of said member being constructed to allow the negative pressure to cause said material to adhere to said surface and to allow said positive pressure to force adhering material away from said surface, and
- means for bringing said member into a receiving position for receiving said material in a first station and transporting said member to a second station having a supporting surface for depositing said material in said second station,
- said pressure selective means including means for controlling the application of said positive pressure in a manner that said copper sheet is deposited by forcing a first portion thereof against said supporting surface of said second station and thereafter forcing the remaining portions of said copper sheet against said supporting surface so that any entrapped air is progressively forced away from said first portion to the edge of said copper sheet from where the air will escape.

23. An apparatus according to claim 22 wherein said material carrying surface is provided with a convex curvature having its center portion furthest away from the center of said member.

24. In a apparatus according to claim 22 wherein said member is divided into three air-tight parallelly extending chambers consisting of a central chamber and two adjacent chambers for receiving said negative and positive air pressure, and
- means for introducing positive pressure in said chambers so that when said material is to be deposited the positive pressure will be introduced first in said central chamber and then in the two adjacent chambers.

25. In a method for stacking uncured copper clad laminate units in a build-up area of a laminating press line, each unit consisting of a metal plate, a glass sheet, and at least one sheet of film-like material, such as a copper sheet, and wherein a copper sheet head is used to pick up, transport, and deposit a copper sheet into a build-up station, the steps comprising:
- uncoiling a predetermined length of copper sheet from a copper let-off unit into a copper sheet pick-up station where said copper sheet head is positionable adjacent to said copper sheet and above said copper sheet station.
- supplying negative air pressure into said head so that said copper sheet is picked-up by said head in a manner that the center line of said head corresponds to that of said copper sheet,
- motivating said copper sheet head transversely to position said head directly above said build-up station, and
- supplying positive air pressure into said head so that said copper sheet is deposited onto said build-up station in a manner that the center line of said copper sheet correponds to that of said stacked laminate units, and free from the entrapment of air between said copper sheet and said laminate units.

26. In a method according to claim 25, wherein said head consists of at least three air tight chambers extending parallelly along the longitudinal axis of said head for receiving said air pressures, and
- wherein said negative air pressure is introduced into said chambers simultaneously to pick up said copper sheet, and said positive air pressure is introduced first into the center chamber for a predetermined period of time followed by introducing said positive air pressure into said side chambers simultaneously to deposit said copper sheet onto said stacked units.

27. In a method according to claims 25 or 26, wherein said uncoiling is done through a power driven continuous belt conveyor system located in said copper sheet pick-up station, the steps further comprising:
- rotating said belt in a direction so that a portion of said belt immediately adjacent said copper let-off unit moves in a direction away from said let-off unit, and at the same time supplying negative air pressure beneath said portion to cause said copper to adhere thereto to form a desired copper sheet length, and
- supplying positive air pressure beneath said copper sheet at the same time said negative air pressure is supplied into said copper pick-up head to raise said copper sheet upwardly against said head.

28. In a method according to claim 25, wherein said uncoiling is done through a power driven continuous belt conveyor system mounted on said copper sheet head, the steps further comprising:
- positioning said head adjacent to said copper let-off unit and above said copper sheet station,
- rotating said belt in a direction so that a portion of said belt immediately adjacent said copper let-off unit moves in a direction away from said let-off unit, and at the same time supplying said negative air pressure into said head for said pick-up and carrying thereof to form a desired copper sheet length.

29. In a method for receiving and depositing film-like material, such as thin copper sheets used in forming laminates, from a first station to a second station, and employing a transfer member having a material carrying surface of substantially the same shape and size of the material to be transported and having a pressure chamber means extending adjacent to and being substantially the same size as said surface, the steps comprising:
- positioning said transfer member above said material in said first station in a position to receive said material,
- supplying negative air pressure into said chamber means so that said material is drawn-up onto said carrying surface, motivating said member still supplying said negative air pressure to position it directly above said second station in a position to deposit said material in said second station, and
- discontinuing said negative air pressure and supplying positive air pressure into said chamber means so that said material is deposited downwardly into said second station in a manner so as to decrease the development of air between the material and said second station.

30. In a method according to claim 29, wherein said chamber means in said member is divided into three air-tight parallelly extending chambers consisting of a central chamber and two opposite adjacent chambers, and wherein the steps further include:
when said member is located above said first station, introducing said negative air pressure into said three chambers simultaneously to pick-up and carry said material, and
when said member is above said second station, introducing said positive pressure into said central chamber to first force the center of said material downwardly into said second station, and then simultaneously introducing positive pressure into said adjacent chambers to force said material outwardly onto said second station, thereby eliminating a substantial amount of air from being entrapped between said material and said second station.

31. In a method according to claim 29, wherein said material is supported on support means in said first station, the steps further including:
supplying negative air in said support means beneath said material at the same time said positive air is being supplied to said member to cause said sheet to be raised upwardly onto said carrying surface of said member.

32. An arrangement for forming at least one uncured laminate unit, consisting of several sheets of different material, in a build-up area of a laminating press line comprising:
a build-up station for receiving said several sheets and having a discharged side,
a first material preparation station located transversely of and in line with said build-up station, said first material preparation station comprising:
means for supporting at least a first material in coil form and for dispensing said material from said coil,
conveying means located adjacent said supporting and dispensing means for receiving the leading end of said coiled material, and constructed and arranged to carry said material along said first material preparation station a distance to form an as yet unsheared desired length of sheet of said material,
means for shearing said sheet of material in said first station to said desired length,
said conveying means including a means for picking up and transporting said sheared sheet from said first material preparation station to said build-up station for depositing therein, and
a second material preparation station located longitudinally of and in line with said build-up station and on the opposite side of said discharge side thereof, said second material preparation station including means for receiving a second material consisting of a number of individual sheets and for transporting said individual sheets one at a time to said build-up station to form a laminate unit with said first material.

33. An arrangement according to claim 32, wherein said conveying means comprises a continuous belt conveyor system stationarily mounted in said first material preparation station.

34. An arrangement according to claim 32, wherein said conveying means comprises a continuous belt conveyor system mounted on said picking up and transporting means of said first material preparation station.

35. An arrangement according to claim 32, wherein said coiled material is copper, and wherein said laminate unit consists of a metal plate, a pack of glass sheets, and at least one copper sheet, and wherein said material in said first and said second material preparation stations consists of said copper sheet and said glass sheets, respectively.

36. An arrangment according to claim 35, further including a third material preparation station for a metal plate with a plate pick-up and depositing means mounted to travel directly above at least its respective station and said build-up station,
wherein said copper sheet transporting means of said first preparation station is located in transverse alignment with said plate pick-up means,
wherein said transporting means in said second preparation station includes means for picking up and depositing said glass pack sheets, and
wherein said copper transporting means and said plate pick-up and depositing means are arranged in a manner so to travel transversely in time sequence with respect to their relative positioning to each other between their respective pick-up stations and said build-up station, and said glass pick-up and depositing means is arranged in a manner to travel longitudinally of said build-up station in time sequence with said copper transporting means and said plate pick-up means to form said uncured laminate units in said build-up station, and
means for motivating said three material pick-up means in said time sequence, including means for raising and lowering thereof in said respective stations.

* * * * *